US012602007B2

(12) United States Patent
Lee et al.

(10) Patent No.: US 12,602,007 B2
(45) Date of Patent: Apr. 14, 2026

(54) DEVELOPING APPARATUS

(71) Applicant: SAMSUNG ELECTRONICS CO., LTD., Suwon-si (KR)

(72) Inventors: Sungki Lee, Suwon-si (KR); Giljong Kim, Suwon-si (KR); Hakdoo Kim, Anseong-si (KR); Donggeun Hur, Anseong-si (KR); Yoonsu Kim, Suwon-si (KR)

(73) Assignees: SAMSUNG ELECTRONICS CO., LTD.; STI CO., LTD.

( * ) Notice: Subject to any disclaimer, the term of this patent is extended or adjusted under 35 U.S.C. 154(b) by 347 days.

(21) Appl. No.: 18/199,035

(22) Filed: May 18, 2023

(65) Prior Publication Data

US 2023/0418222 A1      Dec. 28, 2023

(30) Foreign Application Priority Data

Jun. 28, 2022      (KR) ........................ 10-2022-0079039

(51) Int. Cl.
*G03G 21/20* (2006.01)
*G03G 15/10* (2006.01)
*H01L 21/683* (2006.01)

(52) U.S. Cl.
CPC ........... *G03G 21/206* (2013.01); *G03G 15/10* (2013.01); *H01L 21/6838* (2013.01); *G03G 2215/00379* (2013.01); *G03G 2215/0658* (2013.01)

(58) Field of Classification Search
CPC ................. G03G 21/206; G03G 15/10; G03G 2215/00379; G03G 2215/0658; H01L 21/6838
See application file for complete search history.

(56) References Cited

U.S. PATENT DOCUMENTS

| | | | |
|---|---|---|---|
| 5,142,429 A | 8/1992 | Jaki | |
| 8,888,952 B2 | 11/2014 | Gigacher et al. | |
| 9,889,476 B2 | 2/2018 | Ishida | |
| 2007/0175863 A1* | 8/2007 | Koyata | ............ H01L 21/02019 216/84 |
| 2009/0285991 A1 | 11/2009 | Kitano et al. | |
| 2016/0240414 A1 | 8/2016 | Conradi et al. | |
| 2017/0316961 A1 | 11/2017 | Nakamori et al. | |

(Continued)

FOREIGN PATENT DOCUMENTS

| | | |
|---|---|---|
| KR | 10-0129712 B1 | 11/1997 |
| KR | 10-2008-0071679 A | 8/2008 |

(Continued)

*Primary Examiner* — David H Banh
(74) *Attorney, Agent, or Firm* — Muir Patent Law, PLLC

(57) ABSTRACT

A developing apparatus includes a body; a buffer plate on the body and including a gas flow path; a vacuum plate on an upper surface of the buffer plate and having a gas supply hole in fluid communication with the gas flow path; and a slit block on an edge of the vacuum plate, the slit block and the vacuum plate forming a flow path for gas from the gas supply hole, wherein a substrate is holdable on the vacuum plate, a contact area between the substrate and the vacuum plate being 90% or more of an area of the substrate, the slit block and the vacuum plate form a buffer space and an inclined first flow path in fluid communication with the buffer space, and the slit block and an edge of the substrate forms a second flow path in fluid communication with the first flow path.

20 Claims, 8 Drawing Sheets

100

(56)          References Cited

U.S. PATENT DOCUMENTS

2018/0284071 A1      10/2018 Wright
2018/0294179 A1*    10/2018 Wang ................ H01L 21/67051
2021/0074574 A1      3/2021 Ji et al.

FOREIGN PATENT DOCUMENTS

| KR | 1020090012364 A | 2/2009 |
|----|------------------|--------|
| KR | 10-2009-0118826 A | 11/2009 |
| KR | 10-2016-0062057 A | 6/2016 |
| KR | 10-2017-0073595 A | 6/2017 |
| KR | 1020180008529 A | 1/2018 |
| KR | 10-2018-0052511 A | 5/2018 |
| KR | 10-2018-0111550 A | 10/2018 |
| KR | 10-2019-0116037 A | 10/2019 |
| KR | 10-2021-0030074 A | 3/2021 |

* cited by examiner

100

DEVELOPING APPARATUS

CROSS-REFERENCE TO RELATED APPLICATION(S)

This application claims benefit of priority to Korean Patent Application No. 10-2022-0079039 filed on Jun. 28, 2022, in the Korean Intellectual Property Office, the disclosure of which is incorporated herein by reference in its entirety.

BACKGROUND

1. Field

Embodiments relate to a developing apparatus.

2. Description of the Related Art

Developing methods are roughly classified into a dipping method, in which a substrate is dipped in a developer bath, a continuous flow method, in which a developer is continuously injected, and a puddle method, using surface tension.

SUMMARY

The embodiments may be realized by providing a developing apparatus including a body; a buffer plate fixedly installed on the body and including a gas flow groove through which a gas is flowable; a vacuum plate fixedly installed on an upper surface of the buffer plate and having a gas supply hole in fluid communication with the gas flow groove; and a slit block fixedly installed on an edge of the vacuum plate, the slit block and the vacuum plate together forming a buffer space and an inclined first flow path for gas supplied through the gas supply hole, wherein a substrate is holdable on the vacuum plate, a contact area between the substrate and the vacuum plate being equal to 90% or more of an area of the substrate, the buffer space and the inclined first flow path are in fluid communication with the buffer space such that the gas is introducible into the buffer space from the gas supply hole, and the slit block together with an edge of the substrate held on the vacuum plate forms a second flow path in fluid communication with the inclined first flow path.

The embodiments may be realized by providing a developing apparatus including a body; a buffer plate fixedly installed on the body and including a gas flow groove through which a gas is flowable; a vacuum plate fixedly installed on an upper surface of the buffer plate and having a gas supply hole in fluid communication with the gas flow groove, the vacuum plate including a plurality of vacuum holes for holding a substrate; and a slit block fixedly installed on an edge of the vacuum plate, the slit block and the vacuum plate together forming a buffer space and an inclined first flow path for gas supplied through the gas supply hole, wherein a contact area between the substrate and the vacuum plate is equal to 90% or more of an area of the substrate when the substrate is held by the vacuum plate, an edge of the substrate protrudes outwardly relative to the edge of the vacuum plate, the buffer space and the inclined first flow path are in fluid communication with the buffer space such that the gas is introducible into the buffer space from the gas supply hole, the slit block together with the edge of the substrate held on the vacuum plate forms a second flow path in fluid communication with to the inclined first flow path, and a cross-sectional area of the second flow path is equal to 70% or less of a cross-sectional area of the gas supply hole.

BRIEF DESCRIPTION OF DRAWINGS

Features will be apparent to those of skill in the art by describing in detail exemplary embodiments with reference to the attached drawings in which.

DETAILED DESCRIPTION

Figure 1:
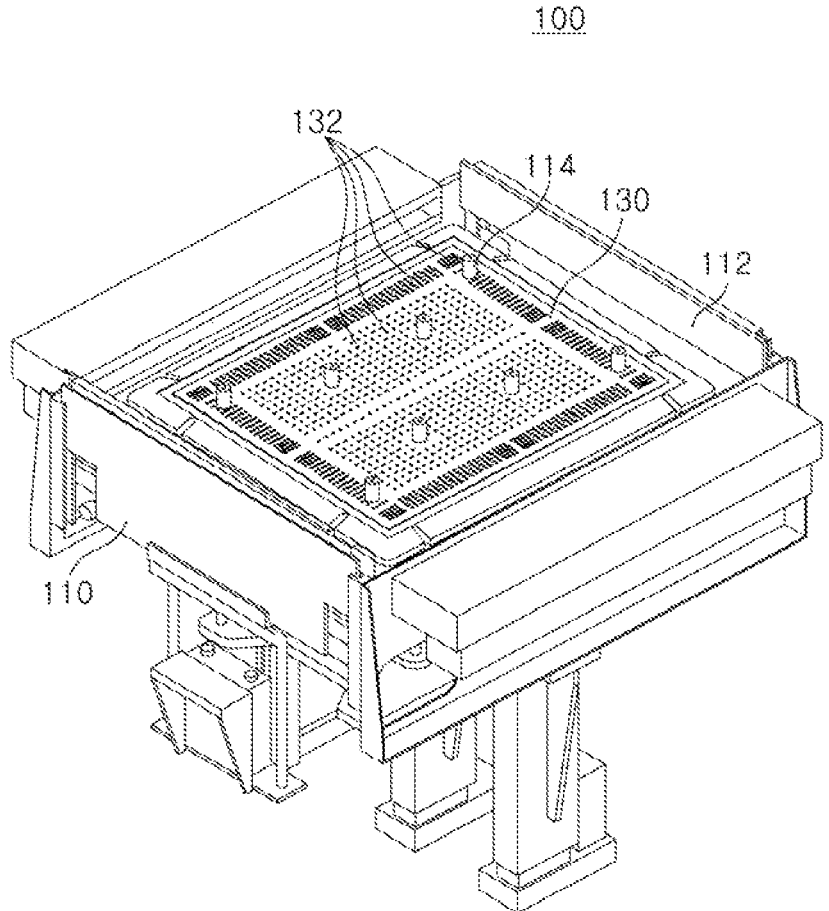
FIG. 1 is a perspective view illustrating some components of a developing apparatus according to an example embodiment.
Figure 2:
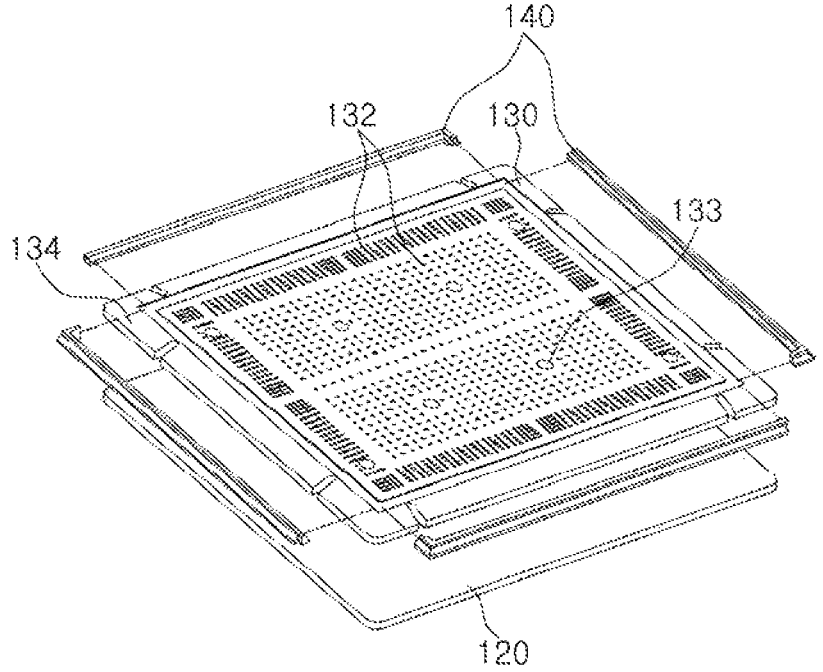
FIG. 2 is an exploded perspective view illustrating a buffer plate, a vacuum plate, and a slit block of the developing apparatus according to an example embodiment.
Figure 3:
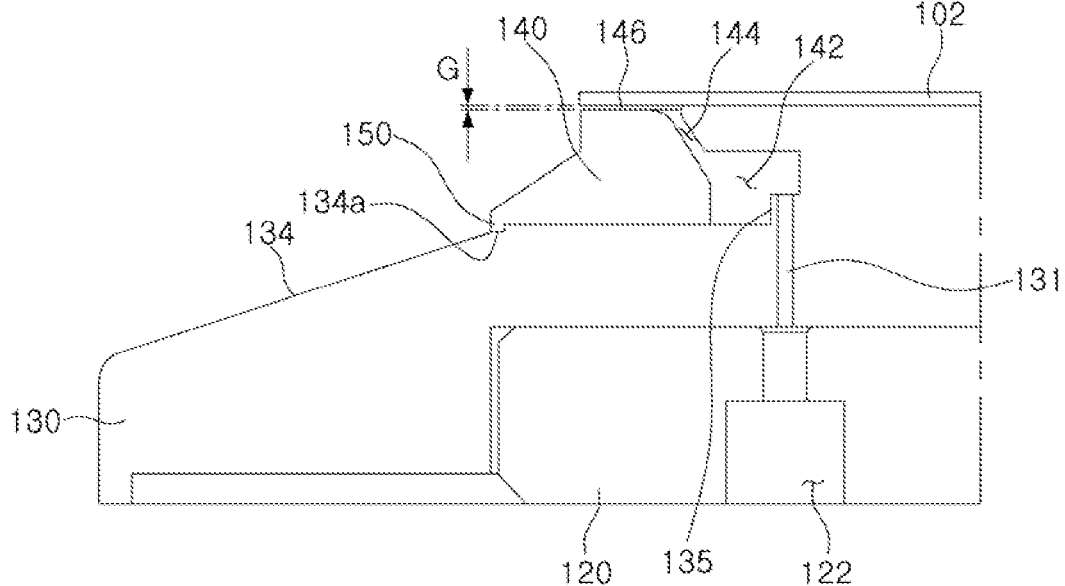
FIG. 3 is a cross-sectional view illustrating a region of the buffer plate, the vacuum plate, and the slit block of the developing apparatus according to an example embodiment.

FIG. 1 is a perspective view illustrating some components of a developing apparatus according to an example embodiment, FIG. 2 is an exploded perspective view illustrating a buffer plate, a vacuum plate, and a slit block of the developing apparatus according to an example embodiment, and FIG. 3 is a cross-sectional view illustrating a region of the buffer plate, the vacuum plate, and the slit block of the developing apparatus according to an example embodiment.

Referring to FIGS. 1 to 3, a developing apparatus 100 according to an example embodiment may include a body 110, a buffer plate 120, a vacuum plate 130, and a slit block 140.

The body 110 may have an internal space in which the buffer plate 120, the vacuum plate 130, and the slit block 140 are accommodated. The body 110 may accommodate a substrate 102 adsorbed to or held on or by the vacuum plate 130, or a shutter 112 through which a wafer enters or exits. A developer supply may be on the body 110 to supply a developer to an upper surface of the substrate 102. A lift pin 114 may be on the body 110 to lift the substrate 102 seated on the vacuum plate 130. In an implementation, the body 110 may be installed inside a process chamber to be isolated from an external entity or environment.

The buffer plate 120 may be fixedly installed on the body 110. The vacuum plate 130 may be on the buffer plate 120. The buffer plate 120 may include a gas flow groove 122 through which gas flows or is flowable. The gas, flowing through the gas flow groove 122, may help prevent the developer (supplied to the substrate 102) from being introduced into or onto a lower surface of the substrate 102. This will be described in detail below.

The vacuum plate 130 may be fixedly installed on, e.g., an upper surface of, the buffer plate 120 and may include a gas supply hole 131 connected to (e.g., in fluid communication with) the gas flow groove 122. The gas supply hole 131 may have a cross-section that is narrower than the gas flow groove 122, and may supply gas to a buffer space 142 to be described below. The vacuum plate 130 may be include a plurality of vacuum holes 132 for holding (e.g., vacuum holding) the substrate 102. The vacuum hole 132 may adsorb or hold the substrate 102, seated on the upper surface of the vacuum plate 130, to the vacuum plate 130. In an implementation, the vacuum holes 132 may help prevent warpage of the substrate 102, seated on the upper surface of the vacuum plate 130, such that the substrate 102 may be maintained in a flat state.

In an implementation, a relatively larger number of vacuum holes 132 may be in or on an edge of the vacuum plate 130 than a number of vacuum holes 132 in or on a central portion of the vacuum plate 130. In an implementation, when the substrate 102 is being held, the substrate 102 may be held by the vacuum holes 132 in the central portion of the vacuum plate 130, and may then be held sequentially by the vacuum holes 132 in or on the edge of the vacuum plate 130 and the vacuum holes 132 in or on a corner side of the vacuum plate 130. Accordingly, warpage of the substrate 102 may be reduced. In an implementation, a region in which the vacuum hole 132 is formed may be equal to approximately 85% or more of an area of the substrate 102.

In an implementation, when the substrate 102 is held by the vacuum plate 130, a contact area between the substrate 102 and the vacuum plate 130 may be equal to 90% or more of the area of the substrate 102. If the contact area between the vacuum plate 130 and the substrate 102 were to be less than 90% of the area of the substrate 102, the risk of the warpage of the substrate 102 could be increased. In an implementation, to prevent the warpage of the substrate 102, the contact area between the substrate 102 and the vacuum plate 130 may be equal to 90% or more of the area of the substrate 102. In an implementation, the edge of the substrate 102 may be protrude from (e.g., outwardly beyond an edge of) the vacuum plate 130.

The vacuum plate 130 may include an installation hole 133 in or through which the lift pin 114 may be installed. In an implementation, the vacuum plate 130 may have a substantially rectangular plate. In an implementation, the vacuum plate 130 may have a shape that may vary depending on a shape of the seated substrate 102 or a seated wafer.

In an implementation, the vacuum plate 130 may include an inclined surface 134 for guiding liquid (e.g., the developer), overflowing from the substrate 102, to flow to the outside of the vacuum plate 130. The inclined surface 134 may be extend from the slit block 140, the liquid may flow to the outside of the vacuum plate 130 due to the inclined surface 134, and the liquid may be prevented from flowing back and contaminating the lower surface of the substrate 102.

Figure 4:
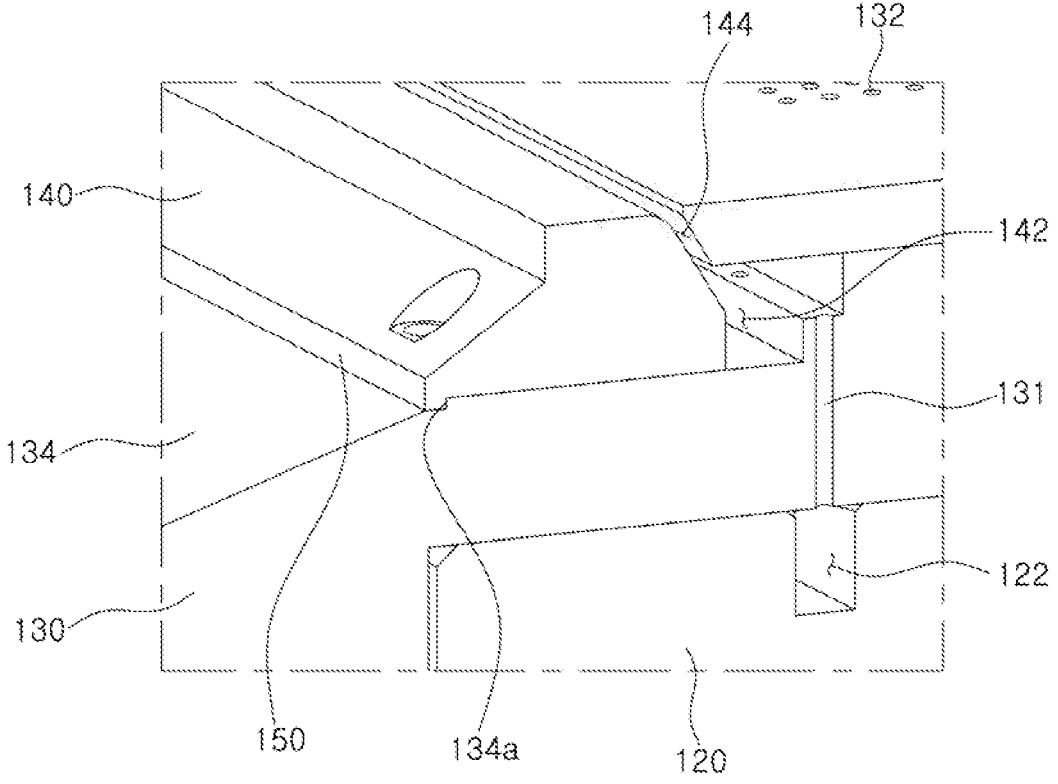
FIG. 4 is a cutaway perspective view illustrating a buffer space and a first flow path of a developing apparatus according to an example embodiment.

In an implementation, as illustrated in FIGS. 3 and 4, the vacuum plate 130 may include a step portion 135 such that a gas supply hole 131, through which gas may be supplied to the buffer space 142 (to be described below), is spaced apart from the bottom surface of the buffer space 142, and an end of the gas supply hole 131 may be open to or at an upper surface of the step portion 135. In an implementation, even if the liquid were to be introduced into the buffer space 142, the liquid may be prevented from being introduced into the gas supply hole 131.

The slit block 140 may be fixedly installed on the edge of the vacuum plate 130 and may provide a flow path of the gas supplied through the gas supply hole 131. In an implementation, four slit blocks 140 may be on the vacuum plate 130 and coupled to the edge of the vacuum plate 130. As illustrated in FIG. 4, the slit block 140 may form the buffer space 142, into which the gas may be introduced, and a first flow path 144, connected to (e.g., in fluid communication with) the buffer space 142 and inclined, together with the vacuum plate 130. The buffer space 142 may help supply a uniform amount of gas to the lower surface of the substrate 102. In an implementation, the gas supplied through the gas supply hole 131 may be supplied to the first flow path 144 at constant amount and at constant pressure and speed. The slit block 140 may form a second flow path 146, connected to or in fluid communication with the first flow path 144, together with the edge of the substrate 102 when the substrate 102 is held by the vacuum plate 130. In an implementation, the developer may be prevented from being introduced onto the lower surface of the substrate 102. In an implementation, the gas may be discharged along the second flow path 146 to help prevent the liquid from being introduced onto the lower surface of the substrate 102. In an implementation, an upper surface of the slit block 140, forming the second flow path 146 together with the substrate 102, may be disposed such that an end of the upper surface of the slit block 140 matches or is aligned with the end of the substrate 102. In an implementation, an end of the upper surface of the slit block 140 may be protrude from (e.g., outwardly beyond) the end of the substrate 102.

In an implementation, a cross-sectional area of the second flow path 146 may be equal to 70% or less of a cross-sectional area of the gas supply hole 131. In an implementation, a pressure of the gas discharged through the second flow path 146 may be higher than an osmotic pressure due to a capillary phenomenon of liquid (e.g., the developer). If the cross-sectional area of the second flow path 146 were to be greater than 70% of the cross-sectional area of the gas supply hole 131, the pressure of the gas flowing through the second flow path 146 could become lower than the osmotic pressure due to the capillary phenomenon of the liquid to introduce the liquid onto the lower surface of the substrate 102 and/or at a side of the second flow path 146, and the lower surface of the substrate 102 could be contaminated. In an implementation, the cross-sectional area of the second flow path 146 may be equal to 70% or less of the cross-sectional area of the gas supply hole 131, and the lower surface of the substrate 102 may be prevented from being contaminated by the liquid (e.g., the developer).

Figure 5:
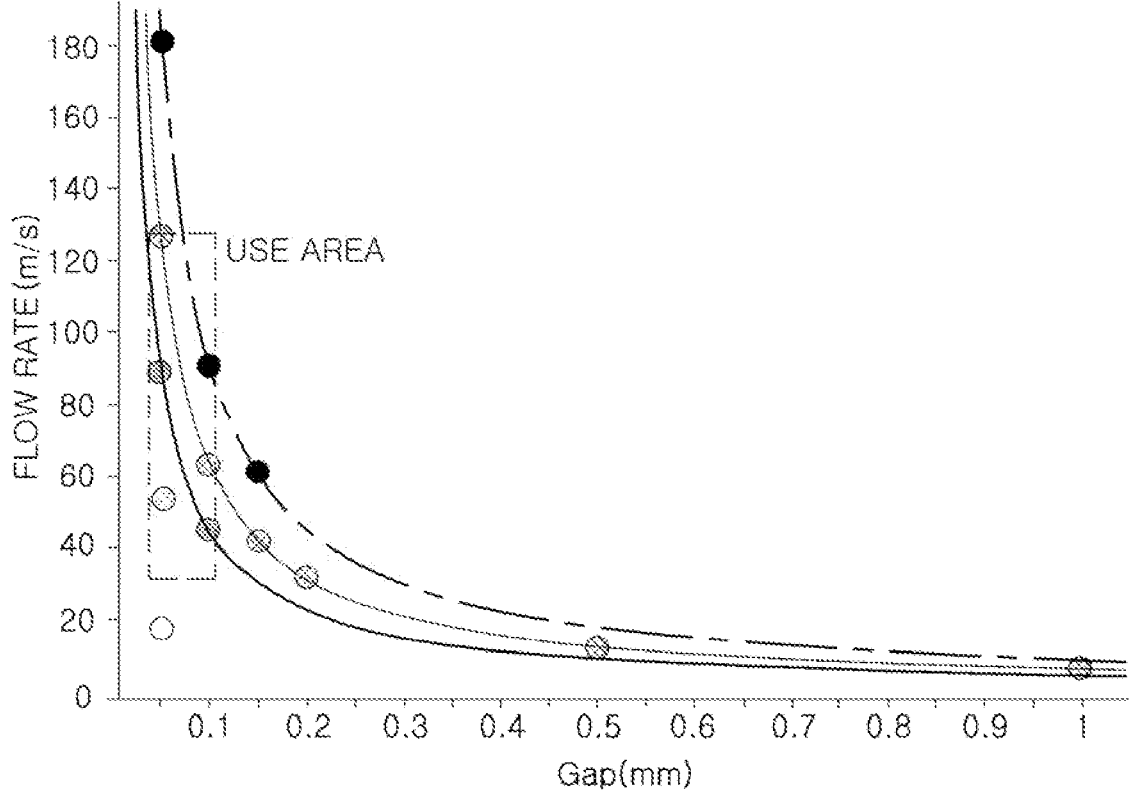
FIG. 5 is a graph illustrating a flow rate of gas discharged through a second flow path depending on a size of a gap forming the second flow path.

In an implementation, a gap G between the lower surface of the substrate 102 and the upper surface of the slit block 140 may be, e.g., 0.05 mm to 0.01 mm. In an implementation, a minimum flow rate of the gas flowing along the second flow path 146 may be, e.g., about 34 m/sec, as illustrated in FIG. 5. In an implementation, the flow rate of the gas flowing along the second flow path 146 may be, e.g., 34 m/sec to 130 m/sec, as illustrated in FIG. 5. If the flow rate of the gas flowing along the second flow path 146 were to be lower than 34 m/sec, the liquid introduced into the lower surface of the substrate 102 could be introduced into the second flow path 146 due to the capillary phenomenon of the liquid. If the flow rate of the gas flowing along the second flow path 146 were to be higher than 130 m/sec, the flow rate of the gas flowing through the second flow path 146 could be significantly high, so that the liquid could be scattered to contaminate the substrate 102.

In an implementation, a cross-sectional area of the first flow path 144 may be equal to or smaller than the cross-sectional area of the second flow path 146. In an implementation, the introduction of the liquid (e.g., the developer) into the second flow path 146 may be further reduced.

Figure 6:
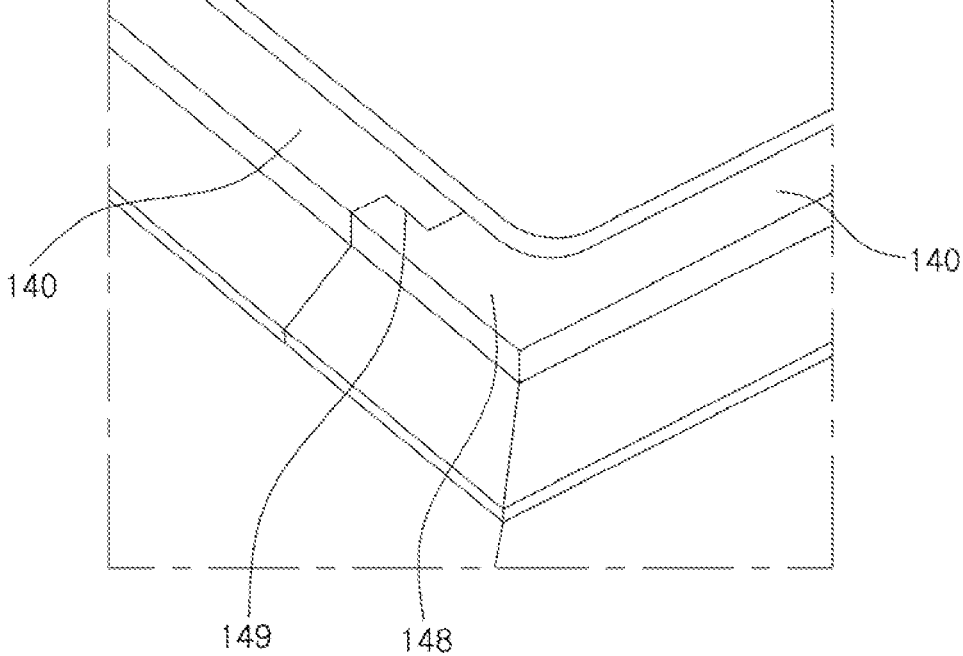
FIG. 6 is an explanatory diagram illustrating a region in which two slit blocks provided in the developing apparatus according to an example embodiment are coupled to each other.

As illustrated in more detail in FIG. 6, one end portion of the slit block 140 may include a projection portion 148, and another end of the slit block 140 may include with a groove 149 corresponding (e.g., complementary) to the projection portion 148. In an implementation, when one slit block 140 is coupled to an adjacent slit block 140, the slit blocks 140 may be coupled to each other while inserting the projection portion 148 into the groove 149.

In an implementation, the projection portion 148 and the groove 149 may be in a region, in which the slit block 140 is coupled, to help further prevent the liquid from being introduced into the region.

In an implementation, the slit block 140 may include an assembly projection 150, as illustrated in more detail in FIG. 4. The assembly projection 150 may be inserted into and coupled to an assembly groove 134*a* in the inclined surface 134 of the vacuum plate 130. In an implementation, the liquid may be prevented from being introduced into the region in which the slit block 140 and the vacuum plate 130 are coupled to each other.

Figure 7:
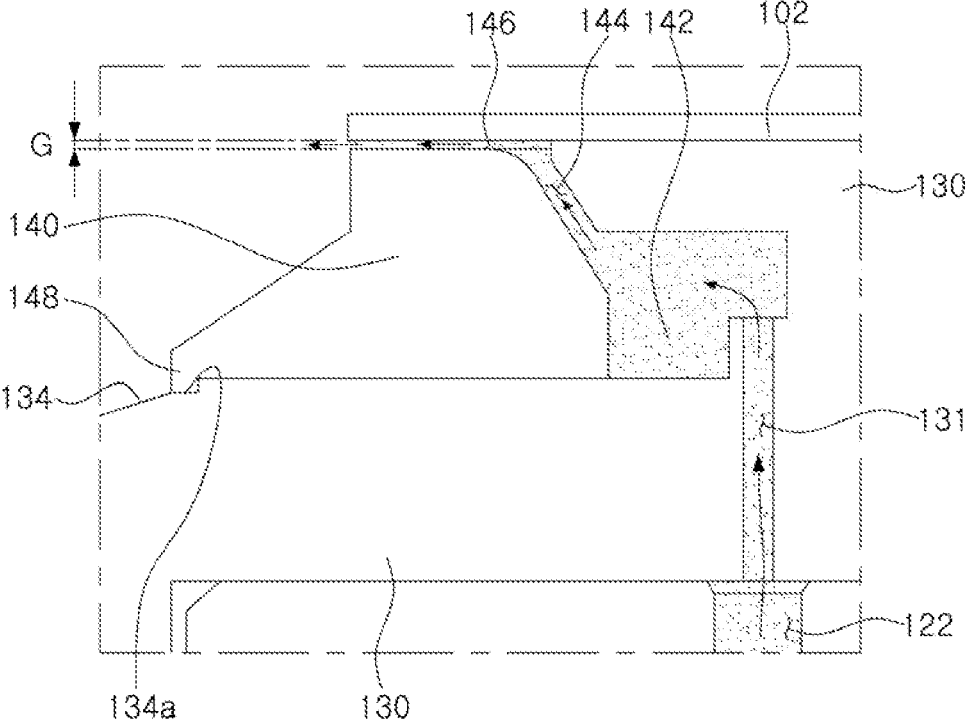
FIG. 7 is an explanatory diagram illustrating a gas flow path.

A description will also be provided with respect to the flow path of the gas preventing the liquid (e.g., the developer) from being introduced onto the lower surface of the substrate 102. As illustrated in FIG. 7, the gas may be supplied through the gas flow groove 122 of the buffer plate 120. Then, the gas flowing along the gas flow groove 122 may flow through the gas supply hole 131 of the vacuum plate 130, and may be introduced into the buffer space 142 while being discharged from the gas supply hole 131 open at the upper surface of the step portion 135 and spaced apart from the bottom surface of the buffer space 142. The gas, introduced into the buffer space 142, may flow along the first flow path 144 formed by the slit block 140 and the vacuum plate 130. Then, the gas may be discharged to an external entity (e.g., to the outside) while flowing along the second flow path 146 formed by the upper surface of the slit block 140 and the lower surface of the substrate 102. Accordingly, the gas discharged from the second flow path 146 may be uniformly injected or flow overall along the edge of the substrate 102. In an implementation, the cross-sectional area of the second flow path 146 may be equal to 70% or less of the cross-sectional area of the gas supply hole 131, so that pressure of the gas discharged through the second flow path 146 may be higher than the osmotic pressure due to the capillary phenomenon of the liquid (e.g., the developer). Accordingly, the liquid (e.g., the developer) supplied to the upper surface of the substrate 102 may be prevented from being introduced onto the lower surface of the substrate 102.

As described above, the gas may flow and be discharged through the second flow path 146 to help prevent the lower surface of the substrate 102 from being contaminated.

Figure 8:
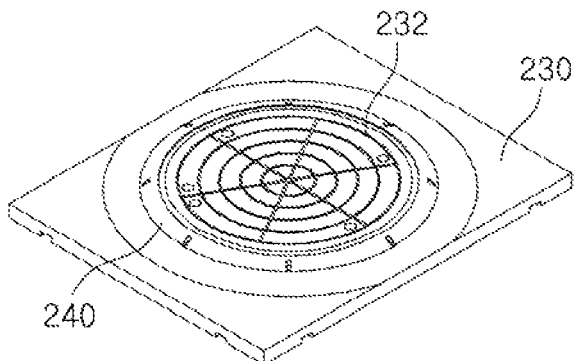
FIG. 8 is a schematic diagram illustrating a vacuum plate and slit block of a developing apparatus according to an example embodiment.

FIG. 8 is a schematic diagram illustrating a vacuum plate and slit block of a developing apparatus according to an example embodiment.

Referring to FIG. 8, a vacuum plate 230 may include a seating portion 232, on which a wafer is seatable, in a central portion thereof, and a slit block 240 may be around the seating portion 232. In an implementation, the slit block 240 and the vacuum plate 230 may form a buffer space, and a first flow path, as set forth in the above-described embodiment, and a second flow path, may be formed by the wafer seated on the slit block 240 and the vacuum plate 230.

By way of summation and review, in the puddle method, developing may be performed while a substrate is maintained in a stationary state after a developer is injected to use surface tension. The developer injected to the substrate could be introduced into a lower portion of the substrate along a side surface of the substrate to contaminate a lower surface of the substrate.

When the developer is introduced to the lower surface of the substrate to contaminate the lower surface of the substrate as described above, malfunctioning of a substrate adsorption portion provided in a developing apparatus could occur.

As described above, the embodiments may also be applied to the developing apparatus for developing a disk-shaped wafer.

As described above, a developing apparatus, capable of reducing contamination of a lower surface of a substrate, may be provided.

One or more embodiments may provide a developing apparatus for reducing contamination of a lower surface of a substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A developing apparatus, comprising:
a body;
a buffer plate fixedly installed on the body and including a gas flow groove through which a gas is flowable;
a vacuum plate fixedly installed on an upper surface of the buffer plate and having a gas supply hole in fluid communication with the gas flow groove; and
a slit block fixedly installed on an edge of the vacuum plate, the slit block and the vacuum plate together forming a buffer space and an inclined first flow path for gas supplied through the gas supply hole,
wherein:
a substrate is holdable on the vacuum plate, a contact area between the substrate and the vacuum plate being equal to 90% or more of an area of the substrate,
the buffer space and the inclined first flow path are in fluid communication with the buffer space such that the gas is introducible into the buffer space from the gas supply hole, and
the slit block together with an edge of the substrate held on the vacuum plate forms a second flow path in fluid communication with the inclined first flow path.

2. The developing apparatus as claimed in claim 1, wherein the second flow path is along a lower surface of the substrate in a direction that is parallel to the lower surface of the substrate.

3. The developing apparatus as claimed in claim 1, wherein a cross-sectional area of the second flow path is equal to 70% or less of a cross-sectional area of the gas supply hole.

4. The developing apparatus as claimed in claim 3, wherein a gap of the second flow path is 0.05 mm to 0.1 mm.

5. The developing apparatus as claimed in claim 3, wherein a flow rate of gas, flowing through the second flow path, is 34 m/sec to 130 m/sec.

6. The developing apparatus as claimed in claim 3, wherein a cross-sectional area of the inclined first flow path is smaller than or equal to the cross-sectional area of the second flow path.

7. The developing apparatus as claimed in claim 1, wherein:

the vacuum plate includes a plurality of vacuum holes for vacuum holding of the substrate, and a number of vacuum holes in the edge of the vacuum plate is larger than a number of vacuum holes in a central portion of the vacuum plate.

8. The developing apparatus as claimed in claim 1, wherein the vacuum plate includes an inclined surface configured to guide a liquid that overflows from the substrate to an outer side of the vacuum plate.

9. The developing apparatus as claimed in claim 8, wherein the slit block includes an assembly projection in an assembly groove in the inclined surface of the vacuum plate.

10. The developing apparatus as claimed in claim 1, wherein the gas supply hole is open to the buffer space in a step portion of the vacuum plate in the buffer space, the gas supply hole being spaced apart from a bottom surface of the buffer space.

11. The developing apparatus as claimed in claim 1, wherein:

one end portion of the slit block includes a projection portion, and another end portion of the slit block includes a groove complementary to and coupled to the projection portion.

12. A developing apparatus, comprising:

a body;

a buffer plate fixedly installed on the body and including a gas flow groove through which a gas is flowable;

a vacuum plate fixedly installed on an upper surface of the buffer plate and having a gas supply hole in fluid communication with the gas flow groove, the vacuum plate including a plurality of vacuum holes for holding a substrate; and a slit block fixedly installed on an edge of the vacuum plate, the slit block and the vacuum plate together forming a buffer space and an inclined first flow path for gas supplied through the gas supply hole, wherein:

a contact area between the substrate and the vacuum plate is equal to 90% or more of an area of the substrate when the substrate is held by the vacuum plate, an edge of the substrate protrudes outwardly relative to the edge of the vacuum plate, the buffer space and the inclined first flow path are in fluid communication with the buffer space such that the gas is introducible into the buffer space from the gas supply hole, the slit block together with the edge of the substrate held on the vacuum plate forms a second flow path in fluid communication with to the inclined first flow path, and a cross-sectional area of the second flow path is equal to 70% or less of a cross-sectional area of the gas supply hole.

13. The developing apparatus as claimed in claim 12, wherein a number of vacuum holes in the edge of the vacuum plate is larger than a number of vacuum holes in a central portion of the vacuum plate.

14. The developing apparatus as claimed in claim 12, wherein the second flow path is along a lower surface of the substrate in a direction that is parallel to the lower surface of the substrate.

15. The developing apparatus as claimed in claim 12, wherein a gap of the second flow path is 0.05 mm to 0.1 mm.

16. The developing apparatus as claimed in claim 12, wherein a flow rate of gas, flowing through the second flow path, is 34 m/sec to 130 m/sec.

17. The developing apparatus as claimed in claim 12, wherein a cross-sectional area of the inclined first flow path is smaller than or equal to the cross-sectional area of the second flow path.

18. The developing apparatus as claimed in claim 12, wherein the vacuum plate includes an inclined surface configured to guide a liquid that overflows from the substrate to an outer side of the vacuum plate.

19. The developing apparatus as claimed in claim 18, wherein the slit block includes an assembly projection in an assembly groove in the inclined surface of the vacuum plate.

20. The developing apparatus as claimed in claim 12, wherein the slit block includes an assembly projection in an assembly groove in a surface of the vacuum plate.

* * * * *